Feb. 3, 1970 R. J. WALSH 3,492,763

METHOD AND APPARATUS FOR MOUNTING SEMICONDUCTOR SLICES

Filed Sept. 18, 1967 2 Sheets-Sheet 1

INVENTOR
ROBERT J. WALSH
BY
Robert J. Schaap
ATTORNEY

INVENTOR
ROBERT J. WALSH
BY
Robert J. Schaap
ATTORNEY

United States Patent Office 3,492,763

Patented Feb. 3, 1970

3,492,763

METHOD AND APPARATUS FOR MOUNTING SEMICONDUCTOR SLICES

Robert J. Walsh, Ballwin, Mo., assignor to Monsanto Company, St. Louis, Mo., a corporation of Delaware Filed Sept. 18, 1967, Ser. No. 668,547
Int. Cl. B24b *19/00, 1/00*
U.S. Cl. 51—277 4 Claims

ABSTRACT OF THE DISCLOSURE

A method of placing semiconductor slices on a carrier plate for further processing. A uniform wax layer or a plurality of wax puddles are applied to the surface of the carrier. A template having a plurality of apertures is aligned with a layout plate and the apertures of the template are disposed in marginal registration with resilient posts on the layout plate. Wafers are inserted through the apertures of the template and disposed on the pedestals. After the template is removed, the wax surface on the carrier plate is brought into contact with the wafers where the wafers become bonded to the surface of the carrier plate in a desired pattern established by the template.

This invention relates in general to certain new and useful improvements in the processing of semiconductor slices, and more particularly to a method for the mounting of semiconductor slices on a carrier for the performing of mechanical operations thereon.

In recent years, semiconductor devices such as silicon controlled rectifiers have found widespread use in the electronics industry. These semiconductor devices are made from semiconductor materials which may have a plurality of layers of semiconductor material having different conductivities and separated by a transition zone. Semiconductor materials of this type having at least two layers of different conductivities with a transition region therebetween are very suitable for use in the formation of electronic members such as diodes, transistors, switches and similar types of electronic structures. One very effective method of producing semiconductor materials is by the epitaxial deposition of silicon on a substrate wafer formed of like material. Generally, the wafers involved must be formed of single crystal silicon with precisely controlled concentrations of doping impurities.

Epitaxial layers are usually grown by heating the silicon substrate in an atmosphere containing hydrogen and the vapor of a volatile silicon compound such as trichlorosilane or silicon tetrachloride along with minute traces of compounds of Group III or Group V doping elements such as boron or phosphorus often in the form of their halides or hydrides.

The substrate wafers are usually cut by diamond sawing single crystal silicon rods of carefully controlled chemical purity which have been grown by the Czochralski or float zone techniques. In order to grow single crystal epitaxial layers of good structure, it is first necessary to carefully prepare the substrate wafer in order to remove that portion of crystal surface which was structurally damaged in the sawing operation. This is conveniently done by removing about 2–3 mils of material from the wafer surface in lapping and polishing operations such as those described in U.S. Patent No. 3,170,273.

It is a common practice to mount a number of semiconductor slices on a metal carrier by means of a thermoplastic wax for processing of the slices through the steps of lapping and polishing in order to eliminate the manual treatment of each slice on an individual basis. In addition to the high degree of surface perfection required on epitaxial substrate wafers, it is also usually necessary to control the wafer thickness to close tolerances. Typically, the thickness variation across a wafer must be controlled within $\pm 0.00025$ inch or less and the center thickness variation from wafer to wafer must be controlled within $\pm 0.0005$ inch or less.

In order to achieve this close control of dimensional tolerances on a number of slices lapped and polished together on a carrier, it is essential that the slices be mounted with their surfaces substantially parallel to one another. It is also essential for the slices to be located substantially symmetrically about the axial center line of the carrier plate and preferably in a pre-established prescribed pattern.

After the wafers have been mounted on the carrier plate, the wafers are then subjected to a number of operations including washing, lapping, polishing, etc. However, if the wafers are not mounted on the carrier plate in a symmetrical or substantially symmetrical pattern with respect to the center of the carrier plate, the weight load distribution on the slices during lapping and polishing is not uniform across the plate. Accordingly, some of the wafers on the plate would be subjected to a greater degree of stock removal in the lapping and polishing steps. For example, if the wafers were placed in a pattern so that the greater portion thereof were on one side of the carrier plate, the wafers on this latter side of the carrier plate would lap and polish at a slower rate than the wafers on the opposite side of the plate, with the result that wafer thickness variations would be introduced across the plate. It is often quite difficult for the operator to properly position each of the wafers on the plate, since the only available method involved is a visual determination of locations for each of the wafers. This method of mounting the wafers generates random patterns of wafer positions and creates undesirable conditions of uniformity among the various wafers.

It is, therefore, the primary object of the present invention to provide a method of mounting semiconductor slices on a carrier for further processing which eliminates deleterious effects of random slice disposition on a carrier plate.

It is another object of the present invention to provide a method for the mounting of semiconductor slices on a carrier in preparation for lapping and polishing to close dimensional tolerances.

It is a further object of the present invention to provide a method of the type stated which permits precise spacing of the wafer slices on the carrier plate in a prescribed pattern.

It is also an object of the present invention to provide a method of the type stated which enables a plurality of semiconductor wafer slices to be treated on a mass-production basis and with a minimum of manual operation.

It is another salient object of the present invention to provide a method of the type stated which permits the mounting of semiconductor wafers on a wax surface without entraining air bubbles therebetween.

It is yet another object of the present invention to provide an apparatus for permitting precisely symmetrical spacing and proper mounting of semiconductor wafers upon a carrier plate.

With the above and other objects in view, my invention resides in the novel features of form, construction, arrangement and combination of parts presently described and pointed out in the claims.

General description

Generally speaking, the present invention relates to a process for the mounting of semiconductor slices and processing the semiconductor slices while they are disposed on the carrier. A suitable wax is deposited on a carrier plate, either in puddles sized for the wafers, or in the form of a thin layer on the carrier plate surface just thick enough to removably hold the slices.

A combination layout plate and template is provided for properly placing each of the wafers in a position for ultimate transfer to the carrier plate. The layout plate is provided with a plurality of upstanding, somewhat flexible and resilient pedestals or posts for supporting the wafers. The pedestals are each located to receive a wafer. The arrangement of the pedestals is designed to establish a pattern for placement of the wafer slices on the carrier plate. The pedestals are substantially diametrally smaller than the wafers which are supported thereon. A template is disposed over and marginally registered with the layout plate, and is provided with an aperture aligned with each of the pedestals on the layout plate. Thus, the wafers are properly positioned on each of the pedestals through the apertures in the template. After a wafer has been disposed on each of the pedestals, the template can be removed.

The carrier plate which has the wax coating thereon is then oriented in an upside down position and disposed over the wafers supported on the resilent pedestals and pressed against the wafers with moderate pressure. The pedestals are designed to yield somewhat so that a compensation for non-uniformity of thicknesses in the various wafer slices is provided. Furthermore, since the central portion of each wafer is pressed firmly against the wax surface by the pedestal, any air which may tend to be trapped under the slice is forced outwardly toward the peripheral margin of the wafers. In this manner, the wafers are then suitably affixed to the carrier plate in a desired pattern which is symmetrical with respect to the center of the carrier plate. After all of the wafer slices have been suitably positioned on the wax surface, the various wafers are placed under a pressure within the range of 1 to 50 pounds per square inch and preferably in the range of 8 to 12 p.s.i. to insure intimate contact of the underside of the wafers with the wax coating.

The mounted wafers are next generally subjected to lapping, grinding and polishing operations. The wafers can be removed from the carrier by any conventional process. Thereafter, the carrier plate is cleaned with a suitable solvent such as trichloroethylene for reuse.

Detailed description

Figure 1:
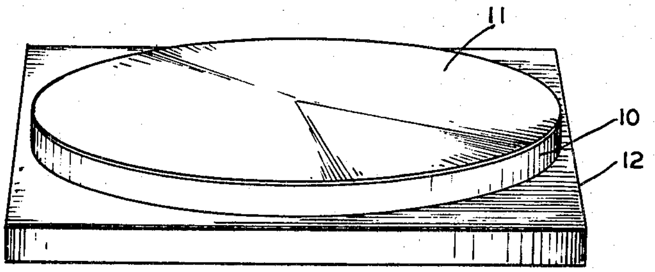
FIGURE 1 is a prerspective view of a wafer mounting plate with a wax adhesive coating on the upper surface thereof.

Referring now in more detail and by reference characters to the drawings, FIGURE 1 represents a wafer support plate 10 or so-called "carrier plate" having a wax coating 11 on the upper surface thereof for supporting a plurality of semi-conductor wafers or so-called "slices" W. The wafer support plate 10 is illustrated as being disposed upon a conventional heating plate 12, where the wax is heated to the mounting temperature. Basically, the wafer supoprt plate 10 is heated to a temperature where the adhesive wax is softened or melted. The wax can also be applied by merely placing small amounts thereof on the surface of the wafer support plate 10 in the areas where it is desired to mount semiconductor wafers. This wax may be melted to a liquid or semi-liquid condition and the wafer W can be pressed into this pool of wax. The wafer is basically pressed against the carrier plate so as to cause the wax to spread out and to be essentially urged out from the underside of the wafer. This layer is only sufficiently thick in order to temporarily affix the wafer to the surface of the carrier plate 10.

There are a number of waxes which can be used in the process of the present invention and include the general categories of animal waxes, mineral waxes and vegetable waxes. Some of the vegetable waxes which are useful in the present invention are carnauba wax, gum dammar, gum mastic, ouricury wax, palm wax, raffia wax, which is wax of the palm group, and candelilla wax. Some of the animal waxes which can be used in the present invention are spermaceti wax, bees wax, shellac wax and wool wax. Many of the mineral waxes are also useful, such as montane wax, which is a butuminous wax occurring in brown coals. Similarly, ozocoerite, which is a hydrocarbon wax is useful in the present invention. Furthermore, a number of the synthetic waxes, which have been developed in recent years, are useful in the present invention. Some of the synthetic waxes which can be employed are ester of polyhydricalalcohols, such as esterified ethylene glycol, diethylene glycol, polyethylene glycol or sorbitol. It is also possible to use many wax blends in the present invention.

It has been found in connection with the present invention that by locating the slices in a specific arrangement on the carrier plate 10, a much greater degree of control over wafer thickness and uniformity of thicknesses between each of the wafers in subsequent operation is achieved. It has been found that if the wafers W are on the carrier plate 10, so that they are substantially symmetrical about the axis of rotation of the plate, pressure which is applied to the plate in subsequent operations is evenly distributed across each of the wafers. However, if the arrangement of the wafers W is not symmetrical about the axis of rotation of the carrier plate 10, some of the wafer slices will bear more of the pressure load in the subsequent operations such as polishing and lapping and hence, a greater portion of the surface thereon will be removed. This results in the introduction of undesirable thickness variations between the wafers on the carrier plate. When the wafers W are hand-mounted on the carrier plate, generally random patterns of mounting have been generated.. This type of mounting lacks the necessary symmetry for proper load distribution and uniform thickness between the wafers is no longer maintained.

Figure 2:
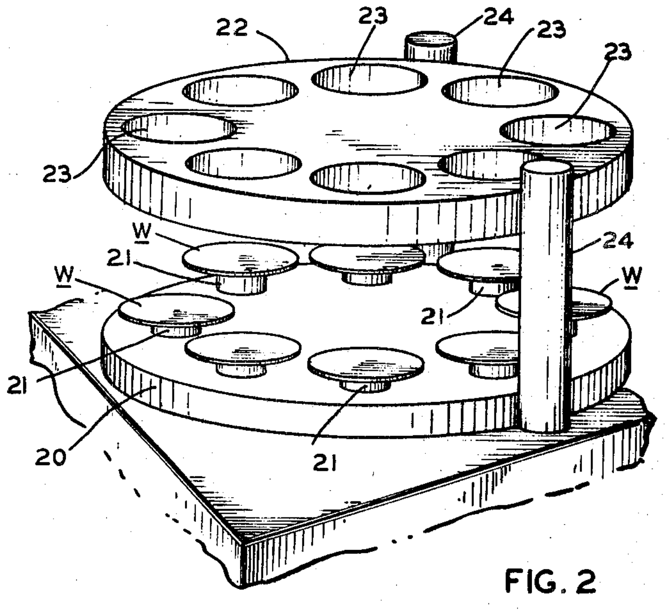
FIGURE 2 is a perspective view showing an apparatus for locating wafer slices on the pedestals of a layout plate.
Figure 3:
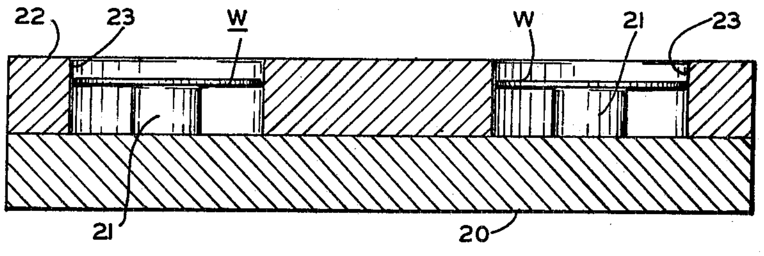
FIGURE 3 is a vertical sectional view showing the placing of wafer slices on the pedestals by use of a template forming part of the present invention.

The present invention, therefore, provides a layout plate 20 illustrated in FIGURES 2 and 3 and includes a plurality of resilient upstanding posts 21, which are located in a pattern for ultimate arrangement of each of the wafers W. The posts 21 are located so that when the wafers W are disposed thereon, a substantially symmetrical pattern about the axial center line of the plate 20 is achieved. The posts 21 are substantially rigid, but yet sufficiently resilient so that they will yield slightly under presssure. Furthermore, they have a diametral size which is approximately one-half of the diametral size of the wafer W disposed thereon. This type of construction can best be seen in FIGURES 2 and 3.

Each of the wafers W is preferably disposed upon the upper surface of the posts 21 with a vacuum pencil in order to eliminate any contact of the wafer W with the hands of an operator. A template 22 is generally disposed on the upper surface of the layout plate 20 in the manner as illustrated in FIGURES 2 and 3. The template 22 is provided with a series of apertures 23, which are arranged in the same pattern as the posts 21. The apertures 23 have substantially the same size as the wafers W or are at least slightly larger than the wafers W. In this manner, the wafers W can be inserted through the apertures 23 and placed on the upper surface of each of the posts 21 in the manner as illustrated. For this purpose, the layout plate 20 and the template 22 may be marginally aligned by means of a pair of upstanding posts 24, which are secured to the surface of any suitable supporting structure. The registration is achieved by merely placing the peripheral margins of the layout plate 20 and the template 22 against the upstanding posts 24. After a wafer has been inserted through each of the apertures 23 and disposed upon the upper surface of each of the posts 21, the template 22 may be removed in the manner as illustrated in FIGURE 2.

Figure 4:
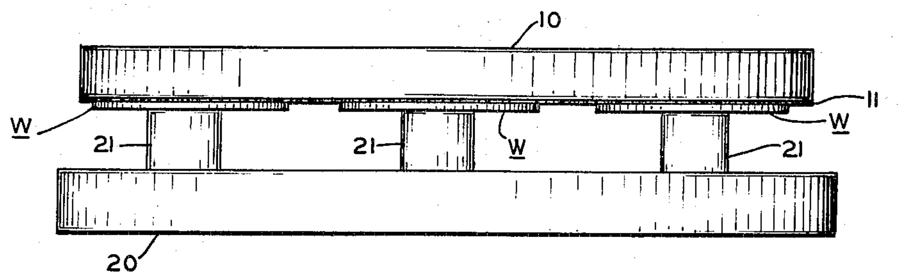
FIGURE 4 is a schematic side elevational view showing the method of affixing the wafer slices to the wax coating of the carrier plate.
Figure 5:
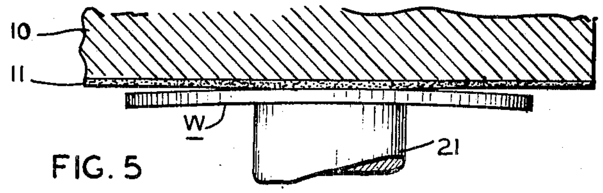
FIGURE 5 is an enlarged vertical sectional view, partially broken away and showing the method of forcing air from the underside of the wax coating when mounting wafers thereon.

The carrier plate 10, which has been brought to the desired mounting temperature is then oriented so that the wax coating 11 is in a downwardly presented position as illustrated in FIGURE 4. The plate 10 is then disposed over the layout plate 20 using the posts 24 to insure alignment and the wax coating 11 is brought into contact with the upwardly presented surface of each of the wafers W. Due to the fact that the posts 21 are somewhat resilient, they will compensate for slight non-uniformity of thickness of the wafers W. In addition, it has been found that this type of mounting greatly reduces the chances of entrapping air bubbles between the surface of the wax 11 and the surface of the wafer W. Due to the fact that the wafer is slightly flexible, the central portion of the wafer will first be pressed into intimate contact with the wax 11. This contact will create an initial "wetting" condition, which will spread outwardly to the peripheral margin of the wafer. As this wetting condition spreads outwardly, any air which exists between the surface of the wax 11 and the wafer W is urged outwardly to the peripheral margins of the wafer as illustrated in FIGURE 5. After the wafers W have been placed in contact with the wax coating 11, the carrier plate 10 can be pressed downwardly so the wafers W are temporarily bonded to the wax coating.

Figure 6:
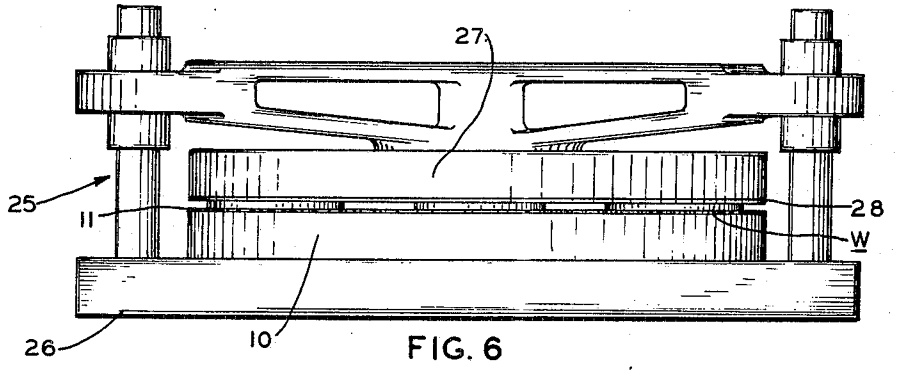
FIGURE 6 is a schematic side elevational view of a conventional press and illustrating the method of pressing the wafer slices on the wax coating.

The carrier plate is next transferred to a press 25, which has a supporting frame 26 and a pressure plate 27, the latter being vertically disposed above the supporting frame 26 in the manner as illustrated in FIGURE 6. The pressure plate 27 is adapted to shift vertically with respect to the stationary supporting frame 26 and engage the upper surfaces of the wafers W. The pressure plate 27 is provided with a somewhat rigid but yet sufficiently flexible rubber pad 28, which is adapted to engage the upwardly presented surface of the wafers W in the manner as illustrated in FIGURE 6. The resiliency of the rubber pad 28 compensates for slight thickness variations of the wafers W and applies substantially uniform pressure on each wafer.

It has been found that pressures ranging from 4 to 20 p.s.i. as applied to the wafers W produce suitable results and are in the preferred pressure range. After pressing for about fifteen seconds, the pressure plate 27 is raised and the carrier plate 10 is removed and allowed to cool to room temperature. The wafers are now firmly but removably bonded to the hard wax surface. The portion of the wax coating 11 not used for slice mounting may be removed if desired by means of a suitable solvent.

After the wafers W have been mounted upon the carrier plate 10 in the desired pattern arrangement, the wafers can then be subjected to further processing operations, such as lapping, washing, and polishing operations. However, these additional operations do not form part of the present invention and are, therefore, neither illustrated nor described in detail herein.

There are many materials in the form of wafers capable of being prepared in accordance with the present invention. These include silicon and germanium crystals; compound semiconductors of III–V series comprising phosphide, arsenides, and antimonides of gallium and indium; compound semiconductors of the II–VI series comprising sulfides, selenides, and tellurides of zinc, cadmium and mercury; compound semiconductors of the I–VII series comprising fluorides, chlorides, bromides and iodides of copper, silver, and gold; and various organic compounds useful as semiconductor materials such as anthracene, metal phthalocyanines, especially copper phthalocyanine and zinc phthalocyanine; polyphthalocyanines; metal polyphthalocyanines, especially copper polyphthalocyanine; and chloranyldurenediamine type complexes.

Figure 7:
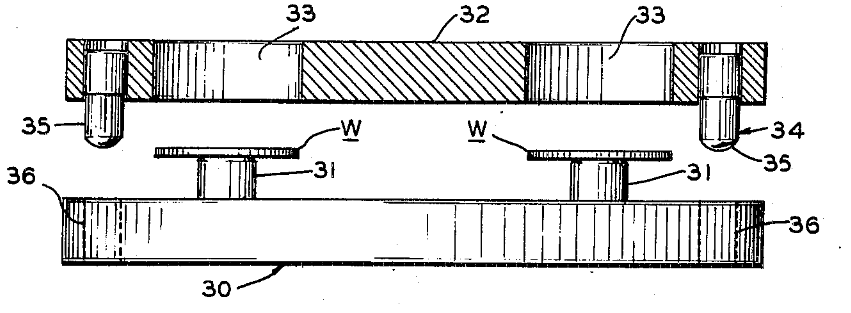
FIGURE 7 is a schematic side elevational view showing a modified form of wafer layout apparatus of the present invention.

It is possible to provide a modified form of wafer layout system which is more fully illustrated in FIGURE 6, and generally includes a layout plate 30, which is substantially similar to the previously described layout plate 20 and includes a plurality of resilient upstanding posts 31. In like manner, the posts 31 are located in a pattern for ultimate arrangement of each of the wafers W. In addition, they are located so that when the wafers W are disposed thereon, a substantially symmetrical pattern about the axial center line of the plate 30 is achieved. The posts 31 are substantially identical to the previously described posts 21. The present invention also provides a template 32 which is substantially similar to the previously described template 22 and can be disposed on the upper surface of the layout plate 30 in the manner as illustrated in FIGURE 7. The template 32 is also provided with a series of apertures 33 which are arranged in the same pattern as the posts 31.

However, this embodiment of the template layout system is provided with an indexing or a registration means 34 which comprises a pair of downwardly extending pins 35 mounted on the underside of the template 32. By reference to FIGURE 7, it can be seen that the pins 35 are sized to extend into recesses or apertures 36 formed on the upper surface of the layout plate 30. Furthermore, it can be seen that these recesses 36 are marginally aligned in vertical registration with the pins 35. Accordingly, when the template 32 is disposed over the layout plate 20, and when the indexing pins 35 are aligned with the recesses 36, the apertures 33 will become automatically aligned with the upstanding posts 31. In this manner, it is possible to properly align the template 32 with respect to the layout plate 30. Furthermore, the indexing pins 35 enable the convenient and easy removal of the template 32 without disturbing any of the wafers W which have been supported on the upstanding ports 31.

It should be understood that changes and modifications in the form, construction, arrangement and combination of parts presently described and pointed out may be made and substituted for those herein shown without departing from the nature and principle of my invention.

Having thus described my invention, what I desire to claim and secure by Letters Patent is:

1. The method of mounting semiconductor slices on a carrier, said method comprising applying a wax coating to said carrier, heating said wax to a slice mounting temperature, inserting said slices through the apertures of a template and locating said slices on upstanding posts in a desired symmetrical pattern across the surface of the carrier, and in such manner so that the slices are centrally supported on said posts bringing the wax coating of said carrier into contact with said slices, establishing the size of said posts to be substantially smaller than said slices so that the slices are initially carried to cause the central portion of the slice to first contact said wax coating thereby causing an initial adhesion with the wax coating which consequently spreads out to the periphery of the slices, and pressing said slices on said wax surface so that said slices become temporarily bonded to the wax surface.

2. The method of mounting semiconductor slices on a carrier, said method comprising applying a wax coating uniformly over the entire surface of said carrier, heating said wax to a suitable mounting temperature, locating a template having apertures in registration with a layout plate having projecting slice supporting elements which elements are substantially smaller than the slices, inserting wafer slices through said apertures and disposing said slices on said elements in such manner that the slices are centrally supported on said elements and assume a slightly curved position thereon, removing said template, bringing the wax coating of said carrier plate into contact with said slices in such manner that central portions of the slices are first contacted with said wax coating to cause an internal adhesion with the wax coating which consequently spreads out to the periphery of the slices, and pressing said slices on said wax surface so that said slices become temporarily bonded to the wax surface.

3. Apparatus for mounting semiconductor slices on a carrier plate having a wax mounting surface thereon, said apparatus comprising a layout plate, plurality of outwardly projecting slice supporting posts mounted on said layout plate and which slice supporting posts are substantially smaller than the slices to be supported thereon, and a template sized to be disposed over said layout plate, said template having apertures in the same pattern as said posts so that the slices can be centrally supported on said posts and assume a slightly curved position thereon and in marginal registration with said posts, said apertures being slightly larger than the slices, said wax surface having the proper consistency so that when the slices are brought into contact with said wax surface the central portion of the slices are first brought into contact with said wax surface to cause an initial adhesion which consequently spreads out to the periphery of the slices.

4. The apparatus of claim 3 further characterized in that said posts have approximately one-half the diametral size of said slices.

References Cited

UNITED STATES PATENTS

| | | | |
|---|---|---|---|
| 3,041,800 | 7/1962 | Heisel | 51—277 |
| 2,838,892 | 6/1958 | Blash | 51—277 |
| 3,049,766 | 8/1962 | Buckminister. | |
| 1,284,283 | 11/1918 | Flad | 51—277 |
| 3,354,938 | 11/1967 | Carignan et al. | 51—277 X |

51—281

JAMES L. JONES, Jr., Primary Examiner

U.S. Cl. X.R.